US011909394B2

(12) United States Patent
Jingu

(10) Patent No.: US 11,909,394 B2
(45) Date of Patent: Feb. 20, 2024

(54) LEVEL SHIFTER CIRCUIT

(71) Applicant: SONY SEMICONDUCTOR SOLUTIONS CORPORATION, Kanagawa (JP)

(72) Inventor: Yoshikatsu Jingu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/756,676

(22) PCT Filed: Nov. 13, 2020

(86) PCT No.: PCT/JP2020/042396
§ 371 (c)(1),
(2) Date: May 31, 2022

(87) PCT Pub. No.: WO2021/117416
PCT Pub. Date: Jun. 17, 2021

(65) Prior Publication Data
US 2022/0416791 A1   Dec. 29, 2022

(30) Foreign Application Priority Data

Dec. 9, 2019 (JP) .................................. 2019-221960

(51) Int. Cl.
*H03K 19/0185* (2006.01)
*H03K 3/037* (2006.01)

(52) U.S. Cl.
CPC ..... *H03K 19/018521* (2013.01); *H03K 3/037* (2013.01); *H03K 19/018528* (2013.01)

(58) Field of Classification Search
CPC ......... H03K 19/018507–018528; H03K 3/037
See application file for complete search history.

(56) References Cited

U.S. PATENT DOCUMENTS 7,199,617 B1 * 4/2007 Schrom .......... H03K 19/018528
327/333
10,050,625 B2 * 8/2018 Oak ............... H03K 19/018528
(Continued)

FOREIGN PATENT DOCUMENTS

| JP | 2007-310207 A | 11/2007 |
| TW | 200737723 A | 10/2007 |
| WO | 2007/089442 A2 | 8/2007 |

OTHER PUBLICATIONS

International Search Report and Written Opinion of PCT Application No. PCT/JP2020/042396, dated Feb. 9, 2021, 15 pages of ISRWO.

*Primary Examiner* — Patrick O Neill
(74) *Attorney, Agent, or Firm* — CHIP LAW GROUP

(57) ABSTRACT

Provided is a level shifter circuit that changes a voltage of a high-frequency input signal to output. Provided is a level shifter circuit provided with a first input terminal and a second input terminal to each of which an input signal having a level between a first potential level and a first reference potential level is input, a first output terminal and a second output terminal from each of which an output signal having a level between a second potential level higher than the first potential level and a second reference potential level is output, a second potential supply node that supplies a voltage at the second potential level, a reference potential supply node that supplies a voltage at the second reference potential level, first and second impedance elements, first to fourth transistors, and first and second nodes, in which each of the first impedance element and the second impedance element includes at least three terminals.

9 Claims, 12 Drawing Sheets

(56) References Cited

U.S. PATENT DOCUMENTS

2007/0182447 A1    8/2007   Quinn
2007/0182616 A1    8/2007   Quinn et al.

* cited by examiner

PRIOR ART

US 11,909,394 B2

LEVEL SHIFTER CIRCUIT

CROSS REFERENCE TO RELATED APPLICATIONS

This application is a U.S. National Phase of International Patent Application No. PCT/JP2020/042396 filed on Nov. 13, 2020, which claims priority benefit of Japanese Patent Application No. JP 2019-221960 filed in the Japan Patent Office on Dec. 9, 2019. Each of the above-referenced applications is hereby incorporated herein by reference in its entirety.

TECHNICAL FIELD

The present technology relates to a level shifter circuit.

BACKGROUND ART

Currently, in order to implement higher performance and integration, an integrated circuit is miniaturized in a field of semiconductor process. With this miniaturization, a power supply voltage of an entire integrated circuit may be lowered.

In contrast, many interface circuits and analog circuits still require a high power supply voltage. Therefore, a level shifter circuit that changes a voltage of an input signal to output is widely used.

Patent Document 1 discloses "an image display device provided with a first PMOS transistor and a second PMOS transistor with source electrodes connected to a power supply voltage and gate electrodes connected to drain electrodes of each other, a first NMOS transistor with a source electrode connected to ground potential, a drain electrode connected to the drain electrode of the first PMOS transistor, and a gate electrode connected to an input terminal, a second NMOS transistor with a source electrode connected to reference potential, a drain electrode connected to the drain electrode of the second PMOS transistor, and a gate electrode connected to an input inversion terminal, a third NMOS transistor with a gate electrode connected to the drain electrodes of the first NMOS transistor and the first PMOS transistor, and a source electrode and a drain electrode connected to the gate electrode of the first NMOS transistor and the drain electrode of the second NMOS transistor, respectively, and a fourth NMOS transistor with a gate electrode connected to the drain electrodes of the second NMOS transistor and the second PMOS transistor, and a source electrode and a drain electrode connected to the gate electrode of the second NMOS transistor and the drain electrode of the first NOS transistor, respectively, the image display device including a level shift unit provided with a plurality of level shift circuits in which at least the third NMOS transistor and the fourth NMOS transistor are formed on an insulator substrate, a pixel unit in which a plurality of pixel circuits is arranged in a matrix on an image display panel, a gate driver unit that generates a signal that scans each of the pixel circuits, and a data driver unit that supplies a video signal to each of the pixel circuits via a data signal line". Patent Document 1 discloses that potential of a node ND2 goes toward an L level by a conduction resistance ratio between the second and third NMOS transistors and the second PMOS transistor.

CITATION LIST

Patent Document

Patent Document 1: Japanese Patent Application Laid-Open No. 2007-310207

SUMMARY OF THE INVENTION

Problems to be Solved by the Invention

However, in the technology disclosed in Patent Document 1, as drain parasitic capacitance of the first NMOS transistor is charged, a resistance value of the fourth NMOS transistor nonlinearly increases. Therefore, a charging speed of the drain parasitic capacitance of the first NMOS transistor sharply decreases.

Furthermore, when the fourth NMOS transistor has a charging action, the third NMOS transistor is turned off, and does not contribute to discharge of the drain parasitic capacitance of the second NMOS transistor.

Therefore, the technology disclosed in Patent Document 1 is effective for a low-frequency signal of several tens of MHz used in, for example, a display driver. However, this is not sufficient for a high-frequency signal of several GHz used in, for example, Bluetooth (registered trademark) and the like.

Therefore, a principal object of the present technology is to provide a level shifter circuit that changes a voltage of a high-frequency input signal to output.

Solutions to Problems

The present technology provides a level shifter circuit provided with a first input terminal and a second input terminal to each of which an input signal having a level between a first potential level and a first reference potential level is input, a first output terminal and a second output terminal from each of which an output signal having a level between a second potential level higher than the first potential level and a second reference potential level is output, a second potential supply node that supplies a voltage at the second potential level, a reference potential supply node that supplies a voltage at the second reference potential level, a first impedance element and a second impedance element, a first transistor that is a first conductivity type transistor, a second transistor that is a second conductivity type transistor, a third transistor that is a first conductivity type transistor, a fourth transistor that is a second conductivity type transistor, and a first node and a second node, in which a control terminal of the second transistor is connected to the first input terminal, a control terminal of the fourth transistor is connected to the second input terminal, the first node is connected to the first output terminal, the second node is connected to the second output terminal, the first transistor is connected between the second potential supply node and the first node, the second transistor is connected between the reference potential supply node and the first node, the third transistor is connected between the second potential supply node and the second node, the fourth transistor is connected between the reference potential supply node and the second node, each of the first impedance element and the second impedance element includes at least three terminals, a first terminal of the first impedance element is connected to the control terminal of the second transistor, a second terminal of the first impedance element is connected to the second node, a third terminal of the first impedance element is connected to a control terminal of the first transistor, a first terminal of the second impedance element is connected to the control terminal of the fourth transistor, a second terminal of the second impedance element is connected to the first node, and a third terminal of the second impedance element is connected to a control terminal of the third transistor.

The first conductivity type transistor may be a P-channel field effect transistor, and the second conductivity type transistor may be an N-channel field effect transistor.

Each of the first impedance element and the second impedance element may include at least one resistance element.

In each of the first impedance element and the second impedance element, the resistance element may be connected between the first terminal and the second terminal.

In each of the first impedance element and the second impedance element, the resistance element may be connected between the first terminal and the third terminal.

Each of the first impedance element and the second impedance element may include at least one capacitance element.

In each of the first impedance element and the second impedance element, the capacitance element may be connected between the first terminal and the second terminal.

In each of the first impedance element and the second impedance element, a resistance element may be connected between the first terminal and the second terminal, and a capacitance element is not required to be connected between the second terminal and the third terminal.

In each of the first impedance element and the second impedance element, the resistance element and the capacitance element may be connected in series between the first terminal and the second terminal.

The level shifter circuit is further provided with a first inverter and a second inverter, in which the first inverter and the second inverter may be connected in series between the first input terminal and the control terminal of the fourth transistor.

When the reference potential supply node is set as a first reference potential supply node, a second reference potential supply node, a third reference potential supply node, a first direct current power supply, a second direct current power supply, a first resistance element, and a second resistance element are further provided, in which the first direct current power supply and the first resistance element may be connected in series in this order from the second reference potential supply node side between the second reference potential supply node and the control terminal of the first transistor, the third terminal of the first impedance element may be connected between the first resistance element and the control terminal of the first transistor, the second direct current power supply and the second resistance element may be connected in series in this order from the third reference potential supply node side between the third reference potential supply node and the control terminal of the third transistor, the third terminal of the second impedance element may be connected between the second resistance element and the control terminal of the third transistor, and each of the first impedance element and the second impedance element may include at least one capacitance element.

MODE FOR CARRYING OUT THE INVENTION

Hereinafter, a preferred mode for carrying out the present technology is described with reference to the attached drawings. Note that, embodiments hereinafter described are representative embodiments of the present technology, and the scope of the present technology is not limited to them. Note that, the present technology is described in the following order.

1. Outline of Present Technology
2. First Embodiment According to Present Technology
3. Verification Result
4. Second Embodiment According to Present Technology

1. OUTLINE OF PRESENT TECHNOLOGY

Figure 1:
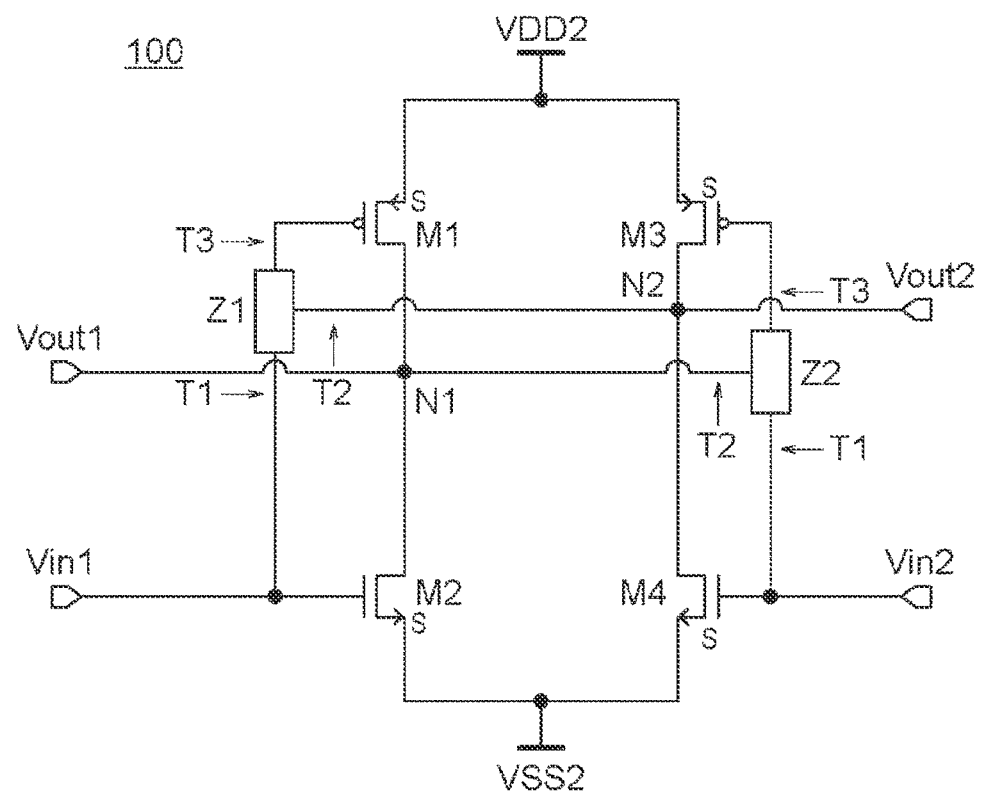
FIG. 1 is a configuration diagram of an embodiment of a level shifter circuit according to the present technology.

FIG. 1 is a configuration diagram of an embodiment of a level shifter circuit 100 according to the present technology. As illustrated in FIG. 1, the level shifter circuit 100 according to the present technology is provided with a first input terminal Vin1 and a second input terminal Vin2 to each of which an input signal having a level between a first potential level VDD1 and a first reference potential level VSS1 is input, a first output terminal Vout1 and a second output terminal Vout2 from each of which an output signal having a level between a second potential level VDD2 higher than the first potential level VDD1 and a second reference potential level VSS2 is output, a second potential supply node VDD2 that supplies a voltage at the second potential level VDD2, a reference potential supply node VSS2 that supplies a voltage at the second reference potential level VSS2, a first impedance element Z1 and a second impedance element Z2, a first transistor M1 that is a first conductivity type transistor, a second transistor M2 that is a second conductivity type transistor, a third transistor M3 that is a first conductivity type transistor, a fourth transistor M4 that is a second conductivity type transistor, and a first node N1 and a second node N2.

A control terminal of the second transistor M2 is connected to the first input terminal Vin1. A control terminal of the fourth transistor M4 is connected to the second input terminal Vin2.

The first node N1 is connected to the first output terminal Vout1. The second node N2 is connected to the second output terminal Vout2.

The first transistor M1 is connected between the second potential supply node VDD2 and the first node N1. The second transistor M2 is connected between the reference potential supply node VSS2 and the first node N1. The third transistor M3 is connected between the second potential supply node VDD2 and the second node N2. The fourth transistor M4 is connected between the reference potential supply node VSS2 and the second node N2.

Each of the first impedance element Z1 and the second impedance element Z2 includes at least three terminals T1 to T3.

The first terminal T1 of the first impedance element Z1 is connected to the control terminal of the second transistor M2. The second terminal T2 of the first impedance element Z1 is connected to the second node N2. The third terminal T3 of the first impedance element Z1 is connected to a control terminal of the first transistor M1.

The first terminal T1 of the second impedance element Z2 is connected to the control terminal of the fourth transistor M4. The second terminal T2 of the second impedance element Z2 is connected to the first node N1. The third terminal T3 of the second impedance element Z2 is connected to a control terminal of the third transistor M3.

The first conductivity type transistor may be, for example, a P-channel field effect transistor. The second conductivity type transistor may be, for example, an N-channel field effect transistor.

An operation of the level shifter circuit 100 is described. The signals input to the first input terminal Vin1 and the second input terminal Vin2 of the level shifter circuit 100 transition between the VSS1 level (first reference potential level) and the VDD1 level (first potential level). The signals of which phases are in a differential relationship (differential signals) are input to the first input terminal Vin1 and the second input terminal Vin2.

The signals output from the first output terminal Vout1 and the second output terminal Vout2 transition between the VSS2 level (second reference potential level) and the VDD2 level (second potential level). The VDD2 level is the potential level higher than the VDD1 level.

First, the operation of the level shifter circuit 100 in a case where the signal at the VDD1 level is input to the first input terminal Vin1 (a case where the input signal rises from VSS1 to VDD1) is described.

The signal at the VDD1 level is input to the first input terminal Vin1. In the second transistor M2, a source voltage is at the VSS2 level, and a gate voltage is at the VDD1 level. Therefore, the second transistor M2 is turned on.

A charge of the first node N1 is discharged to the reference potential supply node VSS2 via the second transistor M2. The present technology accelerates this discharge.

The signal at the VSS1 level is input to the second input terminal Vin2. Therefore, input potential of the second impedance element Z2 decreases toward the VSS1 level. Then, discharge of the first node N1 is promoted via the second impedance element Z2. The third transistor M3 is turned on by discharge promotion of the first node N1. Since the signal at the VDD2 level is supplied to the control terminal of the first transistor M1, the first transistor M1 is turned off. As a result, no charge is supplied from the second potential supply node VDD2 toward the first node N1. Therefore, the discharge of the first node N1 is not suppressed.

As described above, the discharge of the first node N1 is accelerated by turning off of the first transistor M1 and promotion of the discharge by the second impedance element Z2.

Then, the signal at the VSS2 level is output from the first output terminal Vout1.

In contrast, the potential of the second impedance element Z2 decreases toward the VSS1 level, so that a gate voltage of the third transistor M3 decreases toward the VSS1 level. In the third transistor M3, the gate voltage is at the VSS1 level, and a source voltage is at the VDD2 level. Therefore, the third transistor M3 is turned on. In the fourth transistor M4, a gate voltage is at the VSS1 level, and a source voltage is at the VSS2 level. Therefore, the fourth transistor M4 is turned off. As a result, the second node N2 is charged with the charge of the second potential supply node VDD2 via the third transistor M3. The present technology accelerates this charge.

The signal at the VDD1 level is input to the first input terminal Vin1. The signal at the VDD1 level promotes the charge of the second node N2 via the first impedance element Z1.

Then, the signal at the VDD2 level is output from the second output terminal Vout2.

The operation of the level shifter circuit 100 in a case where the signal at the VDD1 level is input to the first input terminal Vin1 (a case where the input signal rises) is described above.

Next, the operation of the level shifter circuit 100 in a case where the signal at the VSS1 level is input to the first input terminal Vin1 (a case where the input signal trails from VDD1 to VSS1) is described.

The signal at the VDD1 level is input to the second input terminal Vin2. In the fourth transistor M4, the source voltage is at the VSS2 level, and the gate voltage is at the VDD1 level. Therefore, the fourth transistor M4 is turned on.

The charge of the second node N2 is discharged to the reference potential supply node VSS2 via the fourth transistor M4. The present technology accelerates this discharge.

The signal at the VSS1 level is input to the first input terminal Vin1. Therefore, input potential of the first impedance element Z1 decreases toward the VSS1 level. Then, the discharge of the second node N2 is promoted via the first impedance element Z1. The first transistor M1 is turned on by discharge promotion of the second node N2. Since the signal at the VDD2 level is supplied to the control terminal of the third transistor M3, the third transistor M3 is turned off. As a result, no charge is supplied from the second potential supply node VDD2 toward the second node N2. Therefore, the discharge of the second node N2 is not suppressed.

As described above, the discharge of the second node N2 is accelerated by turning off of the third transistor M3 and promotion of the discharge by the first impedance element Z1.

Then, the signal at the VSS2 level is output from the second output terminal Vout2.

In contrast, the potential of the first impedance element Z1 decreases toward the VSS1 level, so that a gate voltage of the first transistor M1 decreases toward the VSS1 level. In the first transistor M1, the gate voltage is at the VSS1 level, and a source voltage is at the VDD2 level. Therefore, the first transistor M1 is turned on. In the second transistor M2, the gate voltage is at the VSS1 level, and the source voltage is at the VSS2 level. Therefore, the second transistor M2 is turned off. As a result, the first node N1 is charged with the charge of the second potential supply node VDD2 via the first transistor M1. The present technology accelerates this charge.

The signal at the VDD1 level is input to the second input terminal Vin2. The signal at the VDD1 level promotes the charge of the first node N1 via the second impedance element Z2. Then, the signal at the VDD2 level is output from the first output terminal Vout1. The operation of the level shifter circuit 100 in a case where the signal at the VSS1 level is input to the first input terminal Vin1 (a case where the input signal trails) is described above.

Figure 2:
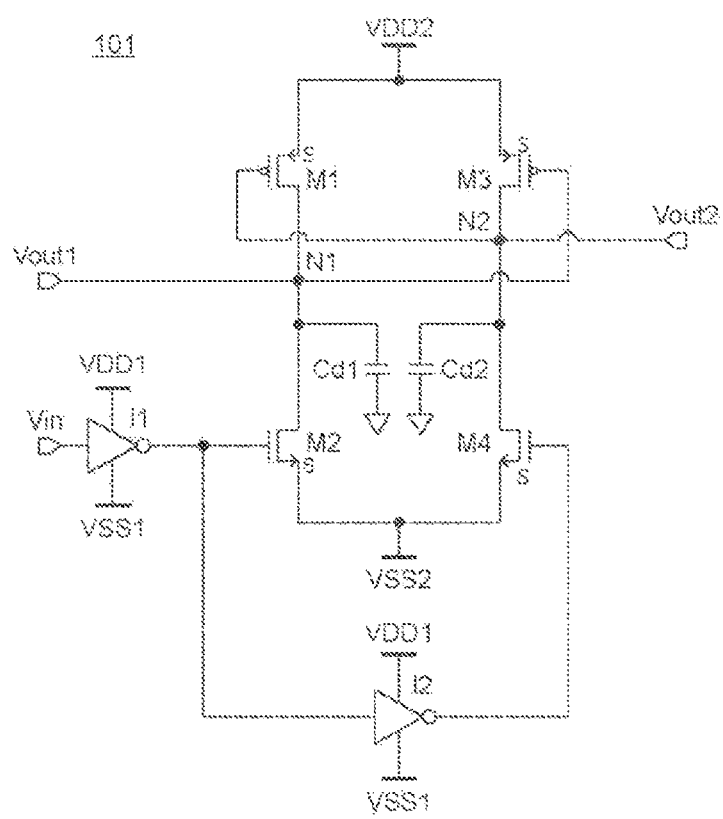
FIG. 2 is a configuration diagram of a basic circuit of a conventionally widely known level shifter circuit.

Here, in order to describe an effect of the present technology, a conventionally widely known level shifter circuit is described. FIG. 2 is a configuration diagram of a basic circuit of a conventionally widely known level shifter circuit 101. As illustrated in FIG. 2, the basic circuit 101 is provided with an input terminal Vin, a first output terminal Vout1, a second output terminal Vout2, a second potential supply node VDD2, a reference potential supply node VSS2, a first transistor M1, a second transistor M2, a third transistor M3, a fourth transistor M4, a first node N1 and a second node N2, and a first inverter I1 and a second inverter I2.

Note that, components similar to those in FIG. 1 are denoted by the same reference numerals, and detailed description thereof is omitted.

First, an operation of the level shifter circuit 100 in a case where a signal at a VSS1 level is input to the input terminal Vin (a case where the input signal trails) is described.

The first inverter I1 inverts the input signal at the VSS1 level and outputs a signal at a VDD1 level. In the second transistor M2, a source voltage is at a VSS2 level, and a gate voltage is at the VDD1 level. Therefore, the second transistor M2 is turned on.

A charge of the first node N1 is discharged to the reference potential supply node VSS2 via the second transistor M2. Potential of the first node N1 decreases toward the VSS2 level.

In contrast, a gate voltage of the third transistor M3 connected to the first node N1 decreases toward the VSS2 level. In the third transistor M3, the gate voltage is at the VSS2 level, and a source voltage is at a VDD2 level. Therefore, the third transistor M3 is turned on. As a result, the second node N2 is charged with the charge of the second potential supply node VDD2 via the third transistor M3. Potential of the second node N2 increases toward the VDD2 level.

Here, when drain parasitic capacitance of the second transistor M2 is set to Cd1, a charge Q1 of the first node N1 becomes the drain parasitic capacitance Cd1× the voltage VSS2 and eventually becomes zero. The drain parasitic capacitance is parasitic capacitance of a field effect transistor due to its structure.

Furthermore, when drain parasitic capacitance of the fourth transistor M4 is set to Cd2, a charge Q2 of the second node N2 becomes the drain parasitic capacitance Cd2× the voltage VDD2.

The operation of the level shifter circuit 100 in a case where the signal at the VSS1 level is input to the input terminal Vin (a case where the input signal trails) is described above.

Next, the operation of the basic circuit 101 in a case where the signal at the VDD1 level is input to the input terminal Vin (a case where the input signal rises) is described.

The first inverter I1 inverts the input signal at the VDD1 level and outputs the signal at the VSS1 level. The second inverter I2 inverts the input signal at the VSS1 level and outputs the signal at the VDD1 level.

In the fourth transistor M4, a gate voltage is at the VDD1 level, and a source voltage is at the VSS2 level. Therefore, the fourth transistor M4 is turned on.

The charge of the second node N2 is discharged to the reference potential supply node VSS2 via the fourth transistor M4.

Immediately before the discharge of the second node N2 is started, the charge of the first node N1 is zero (VSS2 level). Therefore, in the third transistor M3, a gate voltage is at the VSS2 level, and a source voltage is at the VDD2 level. Therefore, the third transistor M3 is turned on. As a result, the charge of the second potential supply node VDD2 flows to the second node N2. Therefore, the discharge of the second node N2 is suppressed.

Immediately before the discharge of the second node N2 is started, the charge of the second node N2 is at the VDD2 level. Therefore, in the first transistor M1 connected to the second node N2, a gate voltage is at the VDD2 level, and a source voltage is at the VDD2 level. Therefore, the first transistor M1 is turned off.

When the voltage of the second node N2 decreases toward the VSS2 level, in the first transistor M1, the gate voltage is at the VSS2 level, and the source voltage is at the VDD2 level. Therefore, the first transistor M1 is turned on. As a result, the voltage of the first node N1 is charged toward the VDD2 level.

If the charge of the first node N1 and the discharge of the second node N2 are accelerated, the basic circuit 101 may change the voltage even for a high-frequency signal of several GHz. However, as described above, the third transistor M3 suppresses the discharge of the second node N2. Therefore, the charge of the first node N1 and the discharge of the second node N2 are at a low speed. It is difficult for the basic circuit 101 to change the voltage for the high-frequency signal of several GHz.

Figure 3:
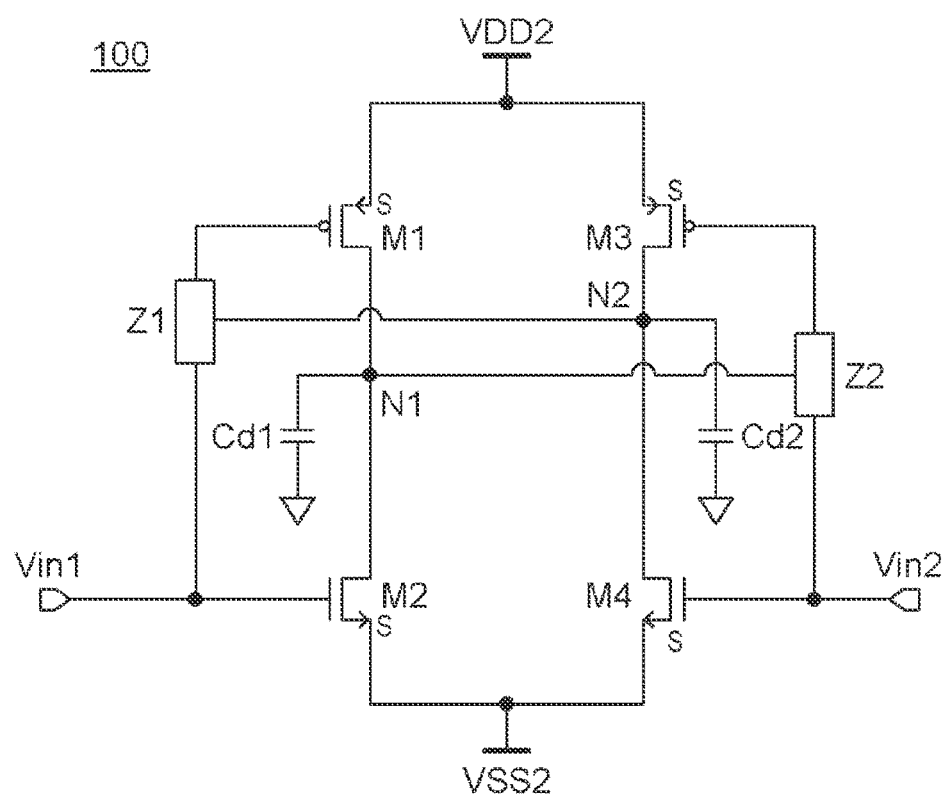
FIG. 3 is a configuration diagram of an embodiment of a level shifter circuit according to the present technology.

FIG. 3 is a configuration diagram of an embodiment of the level shifter circuit 100 according to the present technology. FIG. 3 clearly illustrates drain parasitic capacitance Cd1 of the second transistor M2 and drain parasitic capacitance Cd2 of the fourth transistor M4 with respect to the configuration diagram in FIG. 1. Components similar to those in FIG. 1 are denoted by the same reference numerals, and detailed description thereof is omitted.

Charges are present in the first node N1 and the second node N2 corresponding to the drain parasitic capacitances Cd1 and Cd2. Conventionally, discharge and charge of the charges have been at a low speed, a change in voltage for a high-frequency signal has been insufficient. However, as described above, in the present technology, the first impedance element Z1 and the second impedance element Z2 promote this discharge and charge. Therefore, the level shifter circuit 100 according to the present technology may change the voltage for the high-frequency signal.

According to the present technology, on/off transition of the first transistor M1 and the third transistor M3 is accelerated. Therefore, a current passing through the circuit decreases. As a result, the level shifter circuit 100 according to the present technology consumes low power.

Conventionally, in order to increase a data communication speed, use of a high-frequency signal has been advanced. For example, in the 5G standard, use of a millimeter wave being a high-frequency signal at a frequency of 30 to 300 GHz is assumed.

Furthermore, in order to reduce power of a transmission device, use of a switching amplifier as a transmission amplifier has been advanced. The switching amplifier is an amplifier driven by a clock signal.

To ensure a communication distance between the transmission device and a reception device, the transmission device requires high-power transmission. Therefore, a driving voltage of the switching amplifier is desirably high to some extent.

However, due to miniaturization of an IC process, the driving voltage of the circuit that generates the clock signal tends to be low. Therefore, a level shifter circuit is required at an interface between a clock signal generation circuit having a low driving voltage and the switching amplifier having a high driving voltage. That is, the level shifter circuit 100 according to the present technology is useful for the transmission device for high-speed communication and also contributes to low power consumption.

Moreover, the level shifter circuit 100 according to the present technology is useful not only for a high-frequency input signal but also for a low-frequency input signal. For example, in a case where a large amount of low-frequency current is input to the level shifter circuit, the drain parasitic capacitance is problematically charged with a large amount of charges. However, the first impedance element Z1 and the second impedance element Z2 according to the present technology promote this discharge of the charges. Therefore, performance of the level shifter circuit 100 is improved. The level shifter circuit 100 may appropriately change an input voltage.

The first impedance element Z1 and the second impedance element Z2 according to the present technology may be implemented by using a resistance element or a capacitance element. Therefore, the level shifter circuit 100 according to the present technology may be implemented on a general CMOS process chip.

The level shifter circuit 100 according to the present technology may be used for, for example, a device that communicates data at a high frequency of several GHz or higher. As a specific example, the level shifter circuit 100 according to the present technology may be used for a device that communicates data according to a standard such as Bluetooth (registered trademark) or 5G, for example.

Figure 4:
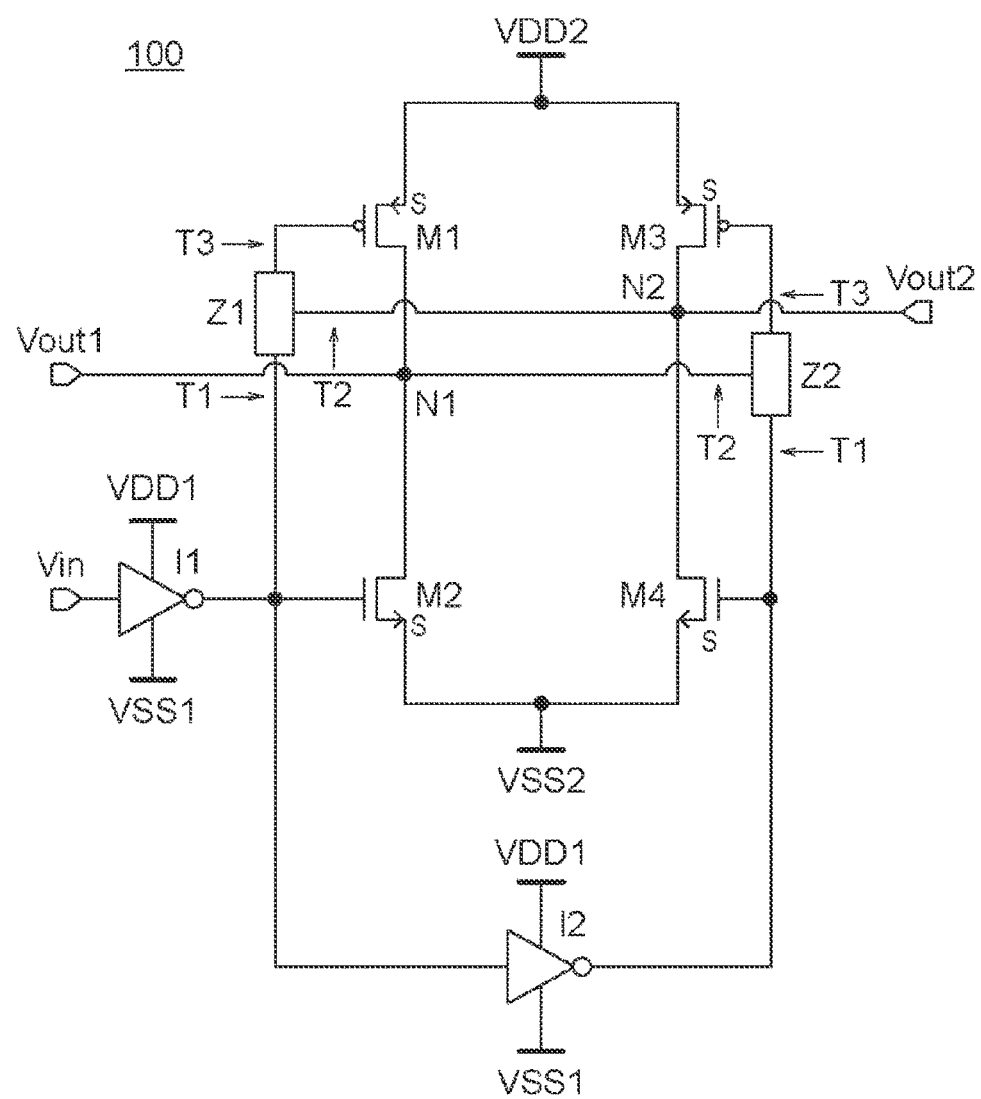
FIG. 4 is a configuration diagram of an embodiment of the level shifter circuit according to the present technology.

Note that, the level shifter circuit 100 according to the present technology may have a configuration as illustrated in FIG. 4. FIG. 4 is a configuration diagram of an embodiment of the level shifter circuit 100 according to the present technology. As illustrated in FIG. 4, the level shifter circuit 100 according to the present technology may further be provided with a first inverter I1 and a second inverter I2.

The first inverter I1 and the second inverter I2 are connected in series between the first input terminal Vin1 and the control terminal of the fourth transistor M4.

Each of the first inverter I1 and the second inverter I2 inverts an input signal to output. Therefore, the first inverter I1 and the second inverter I2 output signals phases of which are in a differential relationship (differential signals).

Since other components are described above, the description thereof is not repeated.

2. FIRST EMBODIMENT ACCORDING TO PRESENT TECHNOLOGY

FIGS. 5A, 5B, 5C, 5D, 6A, 6B, 6C, 6D, 7A, 7B, 7C, 7D, 8A, 8B, 8C, and 8D are configuration diagrams of an embodiment of a first impedance element Z1 and a second impedance element Z2 according to the present technology. Each of the first impedance element Z1 and the second impedance element Z2 includes a first terminal, a second terminal, and a third terminal.

As illustrated in FIGS. 5A, 5B, 5C, 5D, 6A, 6B, 6C, 6D, 7A, 7B, 7C, 7D, 8A, 8B, 8C, and 8D (excluding FIG. 5D), each of the first impedance element Z1 and the second impedance element includes at least one resistance element R1 (R2, R3).

The resistance element R1 (R2, R3) is connected between a first terminal T1 and a second terminal T2. Alternatively, the resistance element R1 (R2, R3) is connected between the first terminal T1 and a third terminal T3.

By including the resistance element R1 (R2, R3), the first impedance element Z1 may promote, for example, charge and discharge of a second node N2. Furthermore, the second impedance element Z2 may promote, for example, charge and discharge of a first node N1.

Furthermore, as illustrated in FIGS. 5A, 5B, 5C, 5D, 6A, 6B, 6C, 6D, 7A, 7B, 7C, 7D, 8A, 8B, 8C, and 8D (excluding FIGS. 5A, 6A, 7A, and 8A), each of the first impedance element Z1 and the second impedance element includes at least one capacitance element C1.

The capacitance element C1 is connected between the first terminal T1 and the second terminal T2. However, the capacitance element C1 is not connected between the second terminal T2 and the third terminal T3. A reason for this is hereinafter described.

As illustrated in FIG. 1, the second terminal T2 of the first impedance element Z1 is connected to the second node N2. The third terminal T3 of the first impedance element Z1 is connected to a control terminal of a first transistor M1.

Here, assume that the first transistor M1 is, for example, a P-channel field effect transistor. The P-channel field effect transistor is turned off when a gate voltage rises to a source voltage. If the capacitance element C1 is connected between the second terminal T2 and the third terminal T3, no direct current flows through the control terminal of the first transistor M1. Therefore, the first transistor M1 is not turned off.

The same applies to the second impedance element Z2 and the third transistor M3. If the capacitance element C1 is connected between the second terminal T2 and the third terminal T3, the third transistor M3 is not turned off.

Therefore, the capacitance element is not connected between the second terminal T2 and the third terminal T3. The resistance element is connected between the second terminal T2 and the third terminal T3 or they are short-circuited.

In contrast, between the first terminal and the second terminal or between the first terminal and the third terminal, it is sufficient that a current for charge and discharge flows, and it is not necessary that the direct current flows. Therefore, the capacitance element C1 may be connected between the first terminal and the second terminal or between the first terminal and the third terminal.

Note that each of the first impedance element Z1 and the second impedance element Z2 may include a plurality of capacitance elements.

Hereinafter, each of configurations of the first impedance element Z1 and the second impedance element Z2 illustrated in FIGS. 5A, 5B, 5C, 5D, 6A, 6B, 6C, 6D, 7A, 7B, 7C, 7D, 8A, 8B, 8C, and 8D are described.

Figures 5A, 5B, 5C, 5D:
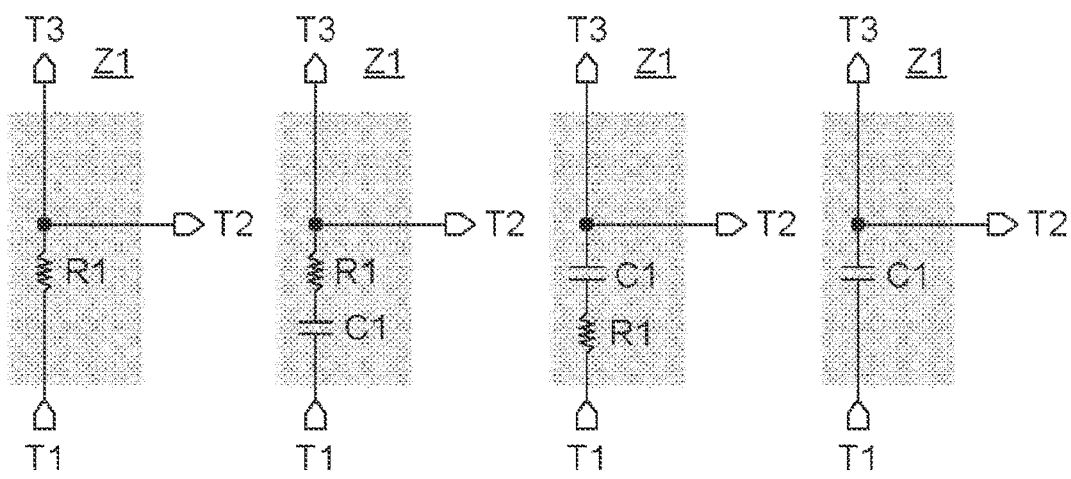
FIGS. 5A, 5B, 5C, and 5D are configuration diagrams of an embodiment of a first impedance element and a second impedance element according to the present technology.

As illustrated in FIG. 5A, the resistance element R1 is connected between the first terminal T1 and the second terminal T2. The second terminal T2 and the third terminal T3 are short-circuited.

As illustrated in FIG. 5B, the capacitance element C1 and the resistance element R1 are connected in series in this order from the first terminal T1 side between the first terminal T1 and the second terminal T2. The second terminal T2 and the third terminal T3 are short-circuited.

As illustrated in FIG. 5C, the resistance element R1 and the capacitance element C1 are connected in series in this order from the first terminal T1 side between the first terminal T1 and the second terminal T2. The second terminal T2 and the third terminal T3 are short-circuited.

As illustrated in FIG. 5D, the capacitance element C1 is connected between the first terminal T1 and the second terminal T2. The second terminal T2 and the third terminal T3 are short-circuited.

Figures 6A, 6B, 6C, 6D:
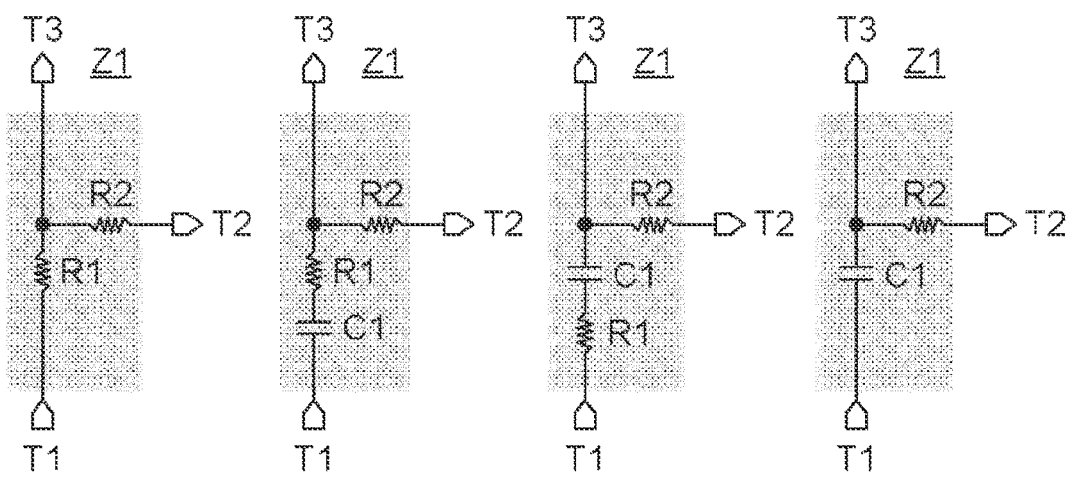
FIGS. 6A, 6B, 6C, and 6D are configuration diagrams of an embodiment of the first impedance element and the second impedance element according to the present technology.

As illustrated in FIG. 6A, the first resistance element R1 and the second resistance element R2 are connected in series in this order from the first terminal T1 side between the first terminal T1 and the second terminal T2. The second resistance element R2 is connected between the second terminal T2 and the third terminal T3. The first resistance element R1 is connected between the first terminal T1 and the third terminal T3.

As illustrated in FIG. 6B, the capacitance element C1, the first resistance element R1, and the second resistance element R2 are connected in series in this order from the first terminal T1 side between the first terminal T1 and the second terminal T2. The second resistance element R2 is connected between the second terminal T2 and the third terminal T3. The capacitance element C1 and the first resistance element R1 are connected in series in this order from the first terminal T1 side between the first terminal T1 and the third terminal T3.

As illustrated in FIG. 6C, the first resistance element R1, the capacitance element C1, and the second resistance element R2 are connected in series in this order from the first terminal T1 side between the first terminal T1 and the second terminal T2. The second resistance element R2 is connected between the second terminal T2 and the third terminal T3. The first resistance element R1 and the capacitance element C1 are connected in series in this order from the first terminal T1 side between the first terminal T1 and the third terminal T3.

As illustrated in FIG. 6D, the capacitance element C1 and the second resistance element R2 are connected in series in this order from the first terminal T1 side between the first terminal T1 and the second terminal T2. The second resistance element R2 is connected between the second terminal T2 and the third terminal T3. The capacitance element C1 is connected between the first terminal T1 and the third terminal T3.

Figures 7A, 7B, 7C, 7D:
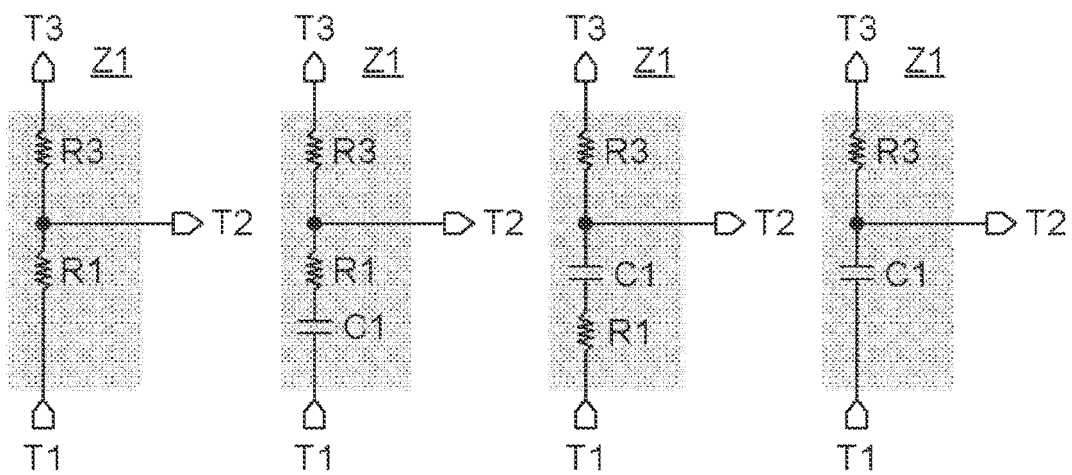
FIGS. 7A, 7B, 7C, and 7D are configuration diagrams of an embodiment of the first impedance element and the second impedance element according to the present technology.

As illustrated in FIG. 7A, the first resistance element R1 is connected between the first terminal T1 and the second terminal T2. The third resistance element R3 is connected between the second terminal T2 and the third terminal T3. The first resistance element R1 and the third resistance element R3 are connected in series in this order from the first terminal T1 side between the first terminal T1 and the third terminal T3.

As illustrated in FIG. 7B, the capacitance element C1 and the first resistance element R1 are connected in series in this order from the first terminal T1 side between the first terminal T1 and the second terminal T2. The third resistance element R3 is connected between the second terminal T2 and the third terminal T3. The capacitance element C1, the first resistance element R1, and the third resistance element R3 are connected in series in this order from the first terminal T1 side between the first terminal T1 and the third terminal T3.

As illustrated in FIG. 7C, the first resistance element R1 and the capacitance element C1 are connected in series in this order from the first terminal T1 side between the first terminal T1 and the second terminal T2. The third resistance element R3 is connected between the second terminal T2 and the third terminal T3. The first resistance element R1, the capacitance element C1, and the third resistance element R3 are connected in series in this order from the first terminal T1 side between the first terminal T1 and the third terminal T3.

As illustrated in FIG. 7D, the capacitance element C1 is connected between the first terminal T1 and the second terminal T2. The third resistance element R3 is connected between the second terminal T2 and the third terminal T3. The capacitance element C1 and the third resistance element R3 are connected in series in this order from the first terminal T1 side between the first terminal T1 and the third terminal T3.

Figures 8A, 8B, 8C, 8D:
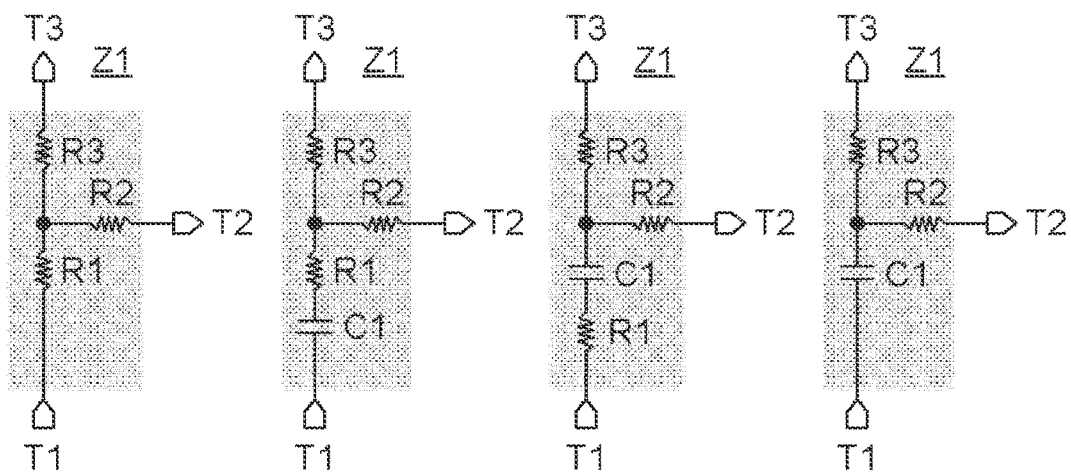
FIGS. 8A, 8B, 8C, and 8D are configuration diagrams of an embodiment of the first impedance element and the second impedance element according to the present technology.

As illustrated in FIG. 8A, the first resistance element R1 and the second resistance element R2 are connected in series in this order from the first terminal T1 side between the first terminal T1 and the second terminal T2. The second resistance element R2 and the third resistance element R3 are connected in series in this order from the second terminal T2 side between the second terminal T2 and the third terminal T3. The first resistance element R1 and the third resistance element R3 are connected in series in this order from the first terminal T1 side between the first terminal T1 and the third terminal T3.

As illustrated in FIG. 8B, the capacitance element C1, the first resistance element R1, and the second resistance element R2 are connected in series in this order from the first terminal T1 side between the first terminal T1 and the second terminal T2. The second resistance element R2 and the third resistance element R3 are connected in series in this order from the second terminal T2 side between the second terminal T2 and the third terminal T3. The capacitance element C1, the first resistance element R1, and the third resistance element R3 are connected in series in this order from the first terminal T1 side between the first terminal T1 and the third terminal T3.

As illustrated in FIG. 8C, the first resistance element R1, the capacitance element C1, and the second resistance element R2 are connected in series in this order from the first terminal T1 side between the first terminal T1 and the second terminal T2. The second resistance element R2 and the third resistance element R3 are connected in series in this order from the second terminal T2 side between the second terminal T2 and the third terminal T3. The first resistance element R1, the capacitance element C1, and the third resistance element R3 are connected in series in this order from the first terminal T1 side between the first terminal T1 and the third terminal T3.

As illustrated in FIG. 8D, the capacitance element C1 and the second resistance element R2 are connected in series in this order from the first terminal T1 side between the first terminal T1 and the second terminal T2. The second resistance element R2 and the third resistance element R3 are connected in series in this order from the second terminal T2 side between the second terminal T2 and the third terminal T3. The capacitance element C1 and the third resistance element R3 are connected in series in this order from the first terminal T1 side between the first terminal T1 and the third terminal T3.

Note that, the configuration of the first impedance element Z1 and the configuration of the second impedance element Z2 may be the same as or different from each other.

Note that, a resistance value of the first resistance R1, a resistance value of the second resistance element R2, and a resistance value of the second resistance element R3 may be the same as or different from each other.

3. VERIFICATION RESULT

In order to verify the effect of the present technology, the inventor conducted an experiment on three level shifter circuits. A first one is the basic circuit 101 of the conventionally widely known level shifter circuit described above. A second one is the level shifter circuit illustrated in FIG. 1 of Patent Document 1. A third one is the level shifter circuit 100 of the first embodiment according to the present technology.

Figure 9:
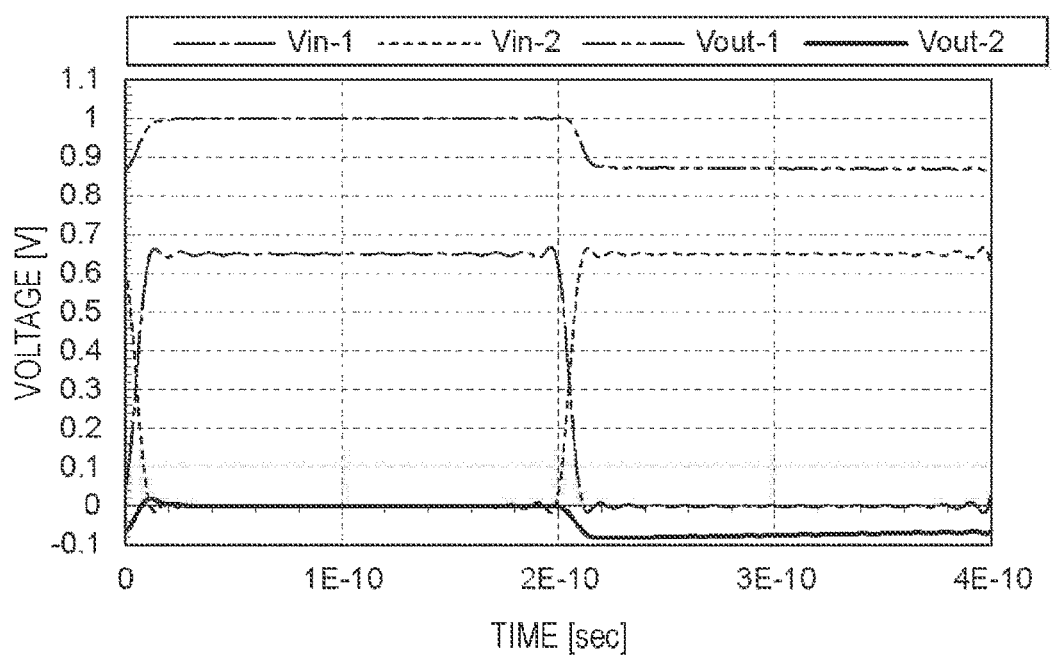
FIG. 9 is a graph illustrating input and output voltages of the basic circuit of the conventionally widely known basic circuit.

First, FIG. 9 is a graph illustrating input and output voltages of the basic circuit 101 of the conventionally widely known level shifter circuit. In FIG. 9, time [sec] is plotted along the abscissa and a voltage [V] is plotted along the ordinate. A first input signal Vin-1 and a first output signal Vout-1 corresponding to the same are illustrated. Furthermore, a second input signal Vin-2 and a second output signal Vout-2 corresponding to the same are illustrated.

A condition of the experiment is described. A first potential level VDD1 is 0.65 V. A second potential level VDD2 is 1 V. A frequency of the input signal is 2.5 GHz. Note that, the condition is the same for the level shifter circuit illustrated in FIG. 1 of Patent Document 1 and the level shifter circuit 100 according to the present technology.

As illustrated in FIG. 9, since the input signal is at a high frequency (2.5 GHz), the conventionally widely known basic circuit 101 cannot perform a correct inverter operation.

Figure 10:
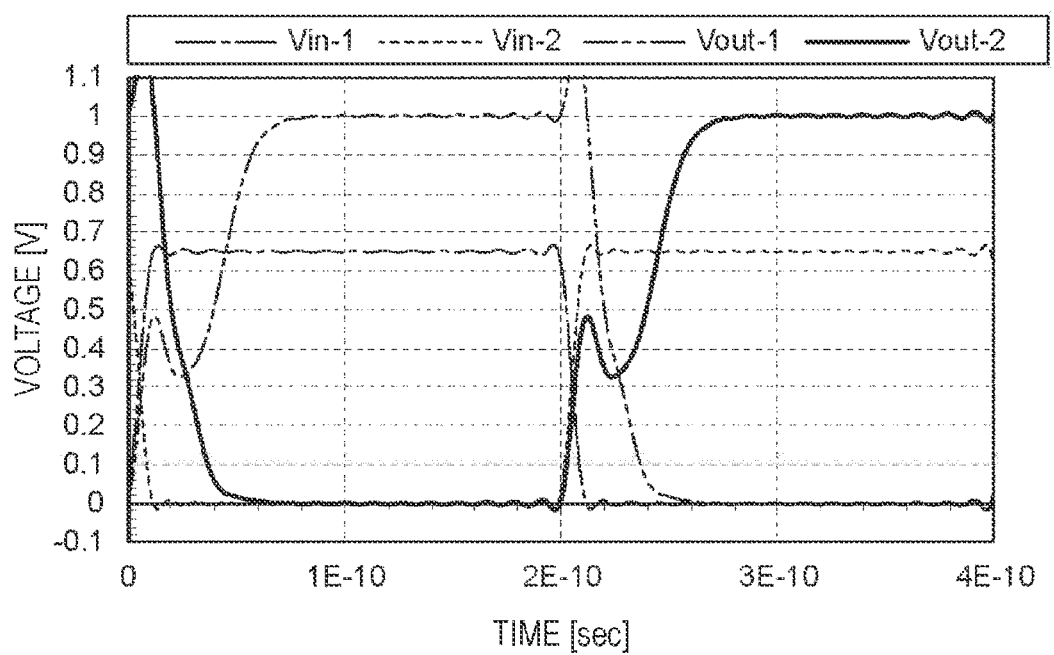
FIG. 10 is a graph illustrating input and output voltages of a level shifter circuit illustrated in FIG. 1 of Patent Document 1.

Next, FIG. 10 is a graph illustrating input and output voltages of the level shifter circuit illustrated in FIG. 1 of Patent Document 1. As illustrated in FIG. 10, the level shifter circuit may perform the inverter operation even though the input signal is at a high frequency. That is, the level shifter circuit raises the first input signal Vin-1 by about 0.35 V (VDD2 -VDD1=1 V–0.65 V=0.35 V) and outputs the first output signal Vout-1. Furthermore, the level shifter circuit raises the second input signal Vin-2 by about 0.35 V and outputs the second output signal Vout-2.

However, waveform distortion occurs at rising and trailing of the first output signal Vout-1 and the second output signal Vout-2. Especially, a rising waveform does not monotonously increase but has an inflection point, and decreases once. For example, in a case where the first output signal Vout-1 and the second output signal Vout-2 are input to an inverter, the inverter might cause malfunction.

Figure 11:
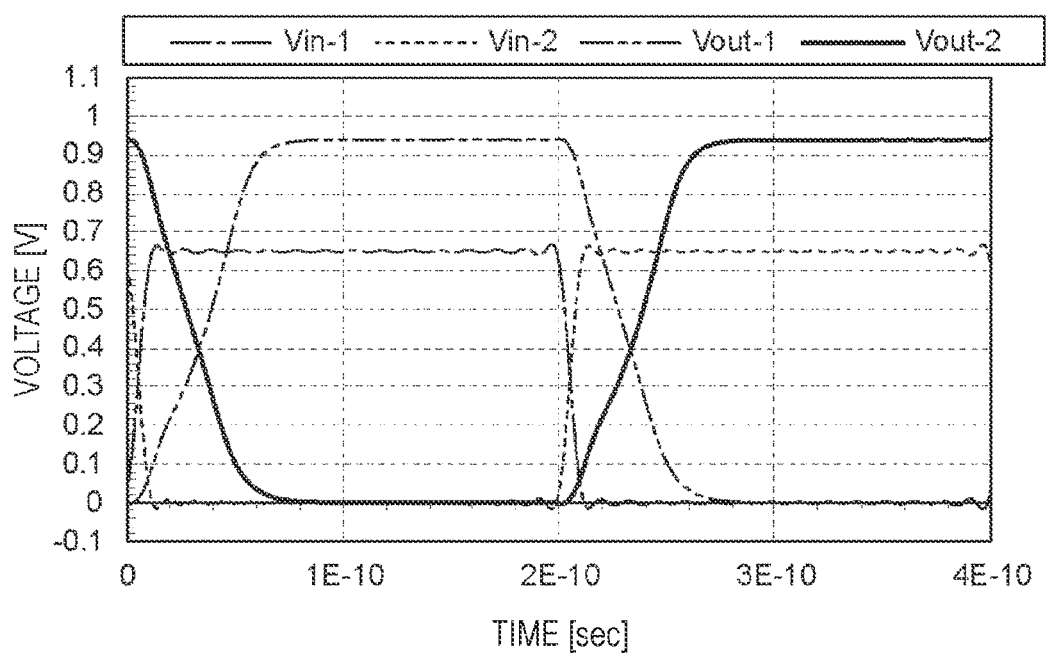
FIG. 11 is a graph illustrating input and output voltages of the level shifter circuit according to the present technology.

Finally, FIG. 11 is a graph illustrating input and output voltages of the level shifter circuit 100 according to the present technology. Note that, in this level shifter circuit 100, each of the first impedance element Z1 and the second impedance element Z2 includes a resistance element. Each of the first impedance element Z1 and the second impedance element Z2 is of an embodiment illustrated in FIG. 5A. A resistance value of this resistance element is 2 kΩ.

As illustrated in FIG. 11, the level shifter circuit 100 may perform the inverter operation even though the input signal is at a high frequency. That is, the level shifter circuit raises the first input signal Vin-1 by about 0.35 V (VDD2-VDD1=1 V–0.65 V=0.35 V) and outputs the first output signal Vout-1.

Furthermore, the level shifter circuit raises the second input signal Vin-2 by about 0.35 V and outputs the second output signal Vout-2.

Moreover, waveform distortion does not occur at rising and trailing of the first output signal Vout-1 and the second output signal Vout-2. As a result, for example, there is no possibility that the inverter causes the malfunction on the signal output side.

4. SECOND EMBODIMENT ACCORDING TO PRESENT TECHNOLOGY

Figure 12:
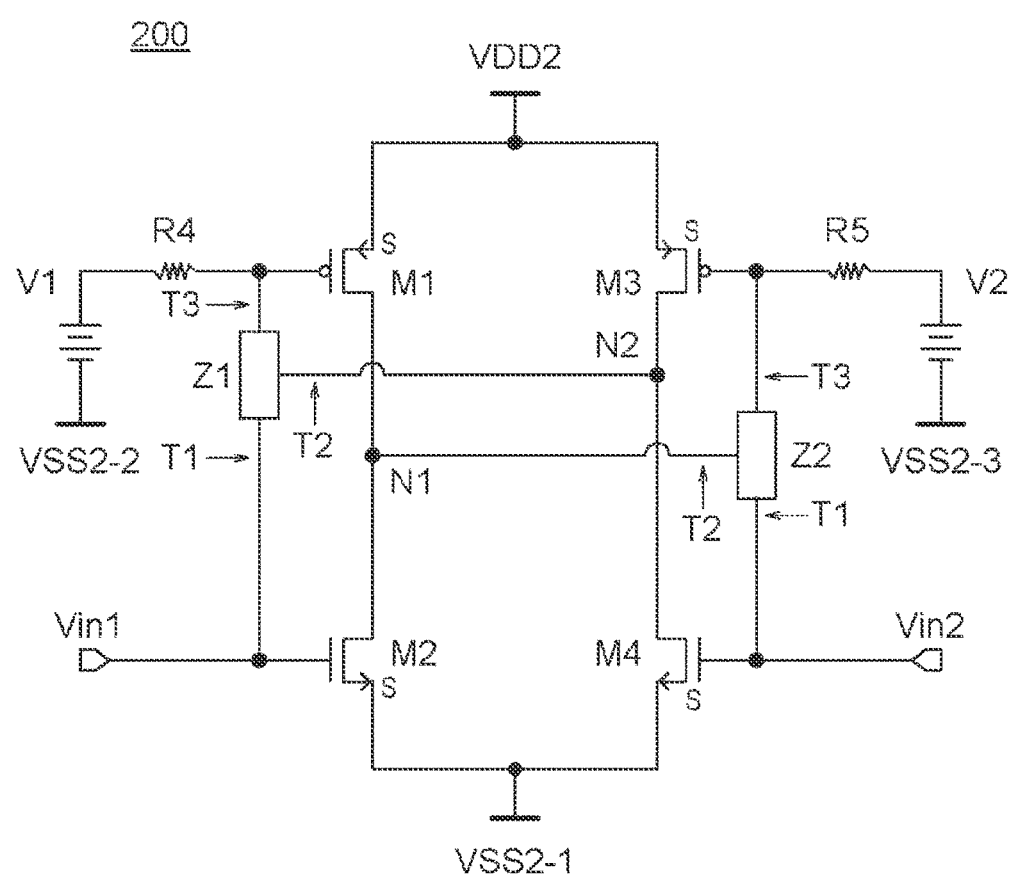
FIG. 12 is a configuration diagram of an embodiment of the level shifter circuit according to the present technology.

FIG. 12 is a configuration diagram of an embodiment of a level shifter circuit 200 according to the present technology. As illustrated in FIG. 12, the level shifter circuit 200 according to the present technology is further provided with, in addition to the level shifter circuit 100 illustrated in FIG. 1, when the reference potential supply node is set as a first reference potential supply node VSS2-1, a second reference potential supply node VSS2-2 that supplies a voltage at the second reference potential level, a third reference potential supply node VSS2-3 that supplies a voltage at the second reference potential level, a first direct current power supply V1, a second direct current power supply V2, a fourth resistance element R4, and a fifth resistance element R5.

Between the second reference potential supply node VSS2-2 and the control terminal of the first transistor M1, the first direct current power supply V1 and the fourth resistance element R4 are connected in series in this order from the second reference potential supply node VSS2-2 side. The third terminal T3 of the first impedance element Z1 is connected between the fourth resistance element R4 and the control terminal of the first transistor M1.

Between the third reference potential supply node VSS2-3 and the control terminal of the third transistor M3, the second direct current power supply V2 and the fifth resistance element R5 are connected in series in this order from the third reference potential supply node VSS2-3 side. The third terminal T3 of the second impedance element Z2 is connected between the fifth resistance element R5 and the control terminal of the third transistor M3.

Each of the first impedance element Z1 and the second impedance element Z2 includes at least one capacitance element C1. The capacitance element C1 is connected between the first terminal T1 and the second terminal T2, and is not connected between the second terminal T2 and the third terminal T3. As a specific example, each of the first impedance element Z1 and the second impedance element Z2 has a configuration illustrated in FIGS. 5B, 5C, 5D, 6B, 6C, 6D, 7B, 7C, 7D, 8B, 8C, and 8D.

Since the first impedance element Z1 includes the capacitance element C1, the control terminal of the first transistor M1 is insulated. Therefore, the gate voltage of the first transistor M1 may be easily controlled by the first direct current power supply V1 and the fourth resistance element R4. As a result, the first transistor M1 is easily turned on and off.

Similarly, since the second impedance element Z2 includes the capacitance element C1, the control terminal of the third transistor M3 is insulated. Therefore, the gate voltage of the third transistor M3 may be easily controlled by the second direct current power supply V2 and the fifth resistance element R5. As a result, the third transistor M3 is easily turned on and off.

As described above, the P-channel field effect transistor is turned off when the gate voltage rises to the source voltage. Therefore, when the first transistor M1 and the third transistor M3 are the P-channel field effect transistors, this configuration facilitates control of the gate voltage. As a result, the first transistor M1 and the third transistor M3 are easily turned on and off.

Note that, the effect described in this specification is illustrative only and is not limited thereto; there may also be another effect.

Note that, the present technology may also have a following configuration.

[1] A level shifter circuit provided with:
a first input terminal and a second input terminal to each of which an input signal having a level between a first potential level and a first reference potential level is input;
a first output terminal and a second output terminal from each of which an output signal having a level between a second potential level higher than the first potential level and a second reference potential level is output;
a second potential supply node that supplies a voltage at the second potential level;
a reference potential supply node that supplies a voltage at the second reference potential level;
a first impedance element and a second impedance element;
a first transistor that is a first conductivity type transistor;
a second transistor that is a second conductivity type transistor;
a third transistor that is a first conductivity type transistor;
a fourth transistor that is a second conductivity type transistor; and
a first node and a second node, in which
a control terminal of the second transistor is connected to the first input terminal,
a control terminal of the fourth transistor is connected to the second input terminal,
the first node is connected to the first output terminal,
the second node is connected to the second output terminal,
the first transistor is connected between the second potential supply node and the first node,
the second transistor is connected between the reference potential supply node and the first node,
the third transistor is connected between the second potential supply node and the second node,
the fourth transistor is connected between the reference potential supply node and the second node,
each of the first impedance element and the second impedance element includes at least three terminals,
a first terminal of the first impedance element is connected to the control terminal of the second transistor,
a second terminal of the first impedance element is connected to the second node,
a third terminal of the first impedance element is connected to a control terminal of the first transistor,
a first terminal of the second impedance element is connected to the control terminal of the fourth transistor,
a second terminal of the second impedance element is connected to the first node, and
a third terminal of the second impedance element is connected to a control terminal of the third transistor.

[2] The level shifter circuit according to [1], in which
the first conductivity type transistor is a P-channel field effect transistor, and
the second conductivity type transistor is an N-channel field effect transistor.

[3] The level shifter circuit according to [1] or [2], in which
each of the first impedance element and the second impedance element includes at least one resistance element.

[4] The level shifter circuit according to [3], in which
in each of the first impedance element and the second impedance element, the resistance element is connected between the first terminal and the second terminal.

[5] The level shifter circuit according to [3] or [4], in which
in each of the first impedance element and the second impedance element, the resistance element is connected between the first terminal and the third terminal.

[6] The level shifter circuit according to any one of [1] to [5], in which
each of the first impedance element and the second impedance element includes at least one capacitance element.

[7] The level shifter circuit according to [6], in which
in each of the first impedance element and the second impedance element, the capacitance element is connected between the first terminal and the second terminal.

[8] The level shifter circuit according to any one of [1] to [7], in which
in each of the first impedance element and the second impedance element,
a resistance element is connected between the first terminal and the second terminal, and
a capacitance element is not connected between the second terminal and the third terminal.

[9] The level shifter circuit according to [8], in which
in each of the first impedance element and the second impedance element,
the resistance element and the capacitance element are connected in series between the first terminal and the second terminal.

[10] The level shifter circuit according to any one of [1] to [9], further provided with:
a first inverter and a second inverter, in which
the first inverter and the second inverter are connected in series between the first input terminal and the control terminal of the fourth transistor.

[11] The level shifter circuit according to any one of [1] to [10], further provided with:
when the reference potential supply node is set as a first reference potential supply node,
a second reference potential supply node;
a third reference potential supply node;
a first direct current power supply;
a second direct current power supply;
a first resistance element; and
a second resistance element, in which
the first direct current power supply and the first resistance element are connected in series in this order from the second reference potential supply node side between the second reference potential supply node and the control terminal of the first transistor,
the third terminal of the first impedance element is connected between the first resistance element and the control terminal of the first transistor,
the second direct current power supply and the second resistance element are connected in series in this order from the third reference potential supply node side between the third reference potential supply node and the control terminal of the third transistor,
the third terminal of the second impedance element is connected between the second resistance element and the control terminal of the third transistor, and
each of the first impedance element and the second impedance element includes at least one capacitance element.

REFERENCE SIGNS LIST

100 Level shifter circuit
200 Level shifter circuit

Vin1 First input terminal
Vin2 Second input terminal
Vout1 First output terminal
Vout2 Second output terminal
VDD2 Second potential supply node
VSS2 Reference potential supply node
Z1 First impedance element
Z2 Second impedance element
M1 First transistor
M2 Second transistor
M3 Third transistor
M4 Fourth transistor
N1 First node
N2 Second node
I1 First inverter
I2 Second inverter
R1 to 5 Resistance element
C1 Capacitance element
T1 First terminal
T2 Second terminal
T3 Third terminal

The invention claimed is:

1. A level shifter circuit, comprising:
a first input terminal and a second input terminal, wherein each of the first input terminal and the second input terminal is configured to receive an input signal having a level between a first potential level and a first reference potential level;
a first output terminal and a second output terminal, wherein each of the first output terminal and the second output terminal is configured to output an output signal having a level between a second potential level higher than the first potential level and a second reference potential level;
a second potential supply node configured to supply a voltage at the second potential level;
a first reference potential supply node configured to supply a voltage at the second reference potential level;
a second reference potential supply node;
a third reference potential supply node;
a first direct current power supply;
a second direct current power supply;
a first resistance element;
a second resistance element;
a first impedance element and a second impedance element;
a first transistor having a first conductivity type;
a second transistor having a second conductivity type;
a third transistor having the first conductivity type;
a fourth transistor having the second conductivity type; and
a first node and a second node, wherein
a control terminal of the second transistor is connected to the first input terminal,
a control terminal of the fourth transistor is connected to the second input terminal,
the first node is connected to the first output terminal,
the second node is connected to the second output terminal,
the first transistor is connected between the second potential supply node and the first node,
the second transistor is connected between the first reference potential supply node and the first node,
the third transistor is connected between the second potential supply node and the second node,
the fourth transistor is connected between the first reference potential supply node and the second node,
each of the first impedance element and the second impedance element includes at least three terminals and at least one capacitance element,
a first terminal of the first impedance element is connected to the control terminal of the second transistor,
a second terminal of the first impedance element is connected to the second node,
a third terminal of the first impedance element is connected to a control terminal of the first transistor,
a first terminal of the second impedance element is connected to the control terminal of the fourth transistor,
a second terminal of the second impedance element is connected to the first node,
a third terminal of the second impedance element is connected to a control terminal of the third transistor,
the first direct current power supply and the first resistance element are connected in series in this order from a side of the second reference potential supply node,
the first direct current power supply and the first resistance element are between the second reference potential supply node and the control terminal of the first transistor,
the third terminal of the first impedance element is connected between the first resistance element and the control terminal of the first transistor,
the second direct current power supply and the second resistance element are connected in series in this order from a side of the third reference potential supply node,
the second direct current power supply and the second resistance element are between the third reference potential supply node and the control terminal of the third transistor, and
the third terminal of the second impedance element is connected between the second resistance element and the control terminal of the third transistor.

2. The level shifter circuit according to claim 1, wherein each of the first transistor and the third transistor is a P-channel field effect transistor, and
each of the second transistor and the fourth transistor is an N-channel field effect transistor.

3. The level shifter circuit according to claim 1, wherein each of the first impedance element and the second impedance element further includes at least one resistance element.

4. The level shifter circuit according to claim 3, wherein in each of the first impedance element and the second impedance element, the at least one resistance element is connected between the first terminal and the second terminal.

5. The level shifter circuit according to claim 3, wherein in each of the first impedance element and the second impedance element, the at least one resistance element is connected between the first terminal and the third terminal.

6. The level shifter circuit according to claim 1, wherein in each of the first impedance element and the second impedance element, the at least one capacitance element is connected between the first terminal and the second terminal.

7. The level shifter circuit according to claim 1, wherein in each of the first impedance element and the second impedance element,
at least one resistance element is connected between the first terminal and the second terminal, and the at least one capacitance element is not connected between the second terminal and the third terminal.

8. The level shifter circuit according to claim 7, wherein in each of the first impedance element and the second impedance element, the at least one resistance element and the at least one capacitance element are connected in series between the first terminal and the second terminal.

9. The level shifter circuit according to claim 1, further comprising a first inverter and a second inverter,
- wherein the first inverter and the second inverter are connected in series between the first input terminal and the control terminal of the fourth transistor.

\* \* \* \* \*